United States Patent [19]

Soneda

[11] Patent Number: 5,774,007
[45] Date of Patent: Jun. 30, 1998

[54] CLOCK DISTRIBUTING APPARATUS HAVING V/I AND I/V CONVERTERS

[75] Inventor: Mitsuo Soneda, Kanagawa, Japan

[73] Assignee: Sony Corporation, Japan

[21] Appl. No.: 730,933

[22] Filed: Oct. 16, 1996

[30] Foreign Application Priority Data

Oct. 17, 1995 [JP] Japan .................................. 7-268590

[51] Int. Cl.$^6$ ........................................................ H03L 7/07
[52] U.S. Cl. ........................................ 327/292; 327/295
[58] Field of Search .................................... 327/291, 292, 327/293, 295, 296, 297, 101, 103, 141, 147, 156

[56] References Cited

U.S. PATENT DOCUMENTS 4,736,323  4/1988  Utsumi et al. ..................... 364/431.12
5,565,816  10/1996  Coteus .................................. 327/297

*Primary Examiner*—Toan Tran
*Assistant Examiner*—T. T. Lam
*Attorney, Agent, or Firm*—Ronald P. Kananen

[57] ABSTRACT

A clock distributing apparatus which can decrease the clock skew and can prevent the swing of a signal on clock transmission lines and can achieve a low power consumption, a lower noise of a power supply, and a high speed operation, wherein converts clock signals adjusted in phase to the same phase as a reference clock by a PLL circuit to current signals by voltage/current converters and sends the current signals to clock transmission lines and converts the current signals transmitted to the clock transmission lines to voltage signals by current/voltage converters and sends the voltage signals to circuit blocks of an integrated circuit.

5 Claims, 4 Drawing Sheets

CLOCK DISTRIBUTING APPARATUS HAVING V/I AND I/V CONVERTERS

BACKGROUND OF THE INVENTION

1. Field of the Invention

The present invention relates to a clock distributing apparatus for distributing clock signals to circuit blocks in a large scale integrated circuit (LSI) chip.

2. Background of the Invention

Generally, an LSI chip is divided into a plurality of circuit blocks. The circuit blocks are connected with each other by the inner interconnections of the chip. The inner interconnections of the chip are used for the transmission of signals between the circuit blocks.

Clock signals CK having a predetermined frequency are supplied to each of the circuit blocks through different clock transmission lines. Generally, a voltage mode transmission system, for example, a complementary metal semiconductor (CMOS) full level transmission system, is adopted as the system for transmission of the clock signals.

However, since the clock signals are transmitted by the voltage mode transmission system and the length of the clock transmission lines supplying the clock signals to the circuit blocks are not equal, the capacitances of the interconnections and resistances of the interconnections of the clock transmission lines are different and have different time constants, the phases of the clock signals distributed to the circuit blocks become different, and, as a result, a clock skew of the LSI increases, so it is difficult to perform a high frequency operation.

SUMMARY OF THE INVENTION

An object of the present invention is to provide a clock distributing apparatus which can decrease the clock skew and can prevent a swing of the signal on the clock transmission lines, which act as nodes having large capacitances, and which can achieve a low power consumption, a lower noise of a power source, and a high speed operation.

According to a first aspect of the present invention, there is provided a clock distributing apparatus having a plurality of circuit blocks supplied with clock signals and a plurality of clock transmission lines supplying respectively different clock signals to the circuit blocks, comprising: a plurality of voltage/current converters which convert the clock signals of a voltage level to current signals and send the current signals to the sending side of the clock transmission lines and a plurality of current/voltage converters which convert the clock current signals to clock voltage clocks at the receiving side of the clock transmission lines.

Preferably, the clock distributing apparatus has a phase locked loop (PLL) circuit which adjusts a phase of the transmitted clock signal to give a predetermined relationship of the phase.

According to a second aspect of the present invention, there is provided a clock distributing apparatus, comprising: first and second transmission lines, a voltage/current converter which converts the clock signals of a voltage level to current signals having complementary levels with each other and sends the current signals to the first and the second transmission lines; and a current/voltage converter which converts the current signals transmitted to the first and the second transmission lines to voltages signals.

Preferably, the clock distributing apparatus has a PLL circuit which adjusts a phase of the transmitted clock signal to give a predetermined relationship of the phase.

Preferably, the current/voltage converter is provided with a first input terminal, a second input terminal having a complementary relationship with the first input terminal, a first metal insulator semiconductor (MIS) transistor and a diode-connected second MIS transistor which are connected in series between the first input terminal and a first power source, a third MIS transistor and a diode-connected fourth MIS transistor which are connected in series between the second input terminal and the first power source, a fifth MIS transistor which constitutes a current mirror circuit with the second MIS transistor, a sixth MIS transistor which constitutes a current mirror circuit with the fourth MIS transistor, a first load MIS transistor connected to a drain of the fifth MIS transistor, and a second load MIS transistor connected to a drain of the sixth MIS transistor, a gate of the first MIS transistor connected to a connection point of the third MIS transistor and the fourth MIS transistor, and a gate of the third MIS transistor connected to the connection point of the first MIS transistor and the second MIS transistor.

Preferably, the fifth MIS transistor and the sixth MIS transistor constitute a current mirror circuit.

According to the present invention, for example, transmitted clock signals, which are adjusted in voltage level to the same phase as the phase of a reference clock signal by a PLL circuit, are converted to current signals and the current signals are then sent to respectively different clock transmission lines.

The clock signals of the current level transmitted to the clock transmission lines are converted to voltage levels by the current/voltage converters and sent to the circuit blocks.

Further, according to the present invention, when the clock signal current flows to the transmission lines, a voltage drop or voltage gain occurs in a first load MIS transistor due to mutual conductance.

As a result, the amplitude of the signal at the first input terminal is changed and input to a first MIS transistor.

On the contrary, a voltage gain or a voltage drop occurs in the second load MIS transistor due to the mutual conductance complementarily to the first load MIS transistor.

As a result, the amplitude of the signal at the second input terminal is changed and input to the second MIS transistor.

The signal voltage, increased or decreased in level, at the second input terminal is supplied to the gate of the first MIS transistor, while the signal voltage, increased or decreased in level, at the first input terminal is supplied to the gate of the second MIS transistor.

Due to this, at the first MIS transistor, the voltage drop or the voltage gain caused by the first load MIS transistor is compensated for to increase or decrease the level, while at the second MIS transistor, the voltage gain or the voltage drop caused by the second load MIS transistor is compensated for to decrease or increase the level.

Accordingly, the change of the amplitude of the signal at the node, that is, the connection point, of the first MIS transistor and the first transmission line, becomes equivalent to zero and, as a result, occurrence of a signal swing at the first transmission line is prevented.

Similarly, the change of the amplitude of the signal at the node, that is, the connection point of the second MIS transistor and the second transmission line becomes equivalent to zero and, as a result, occurrence of a signal swing at the second transmission line is prevented.

BRIEF DESCRIPTION OF THE DRAWINGS

These and other objects and features of the present invention will become more apparent from the following description of the preferred embodiments made with reference to the drawings, in which.

DESCRIPTION OF THE PREFERRED EMBODIMENTS

Before describing the preferred embodiments, an explanation will be given of the related art in more detail with reference to the appended drawings.

Figure 1:
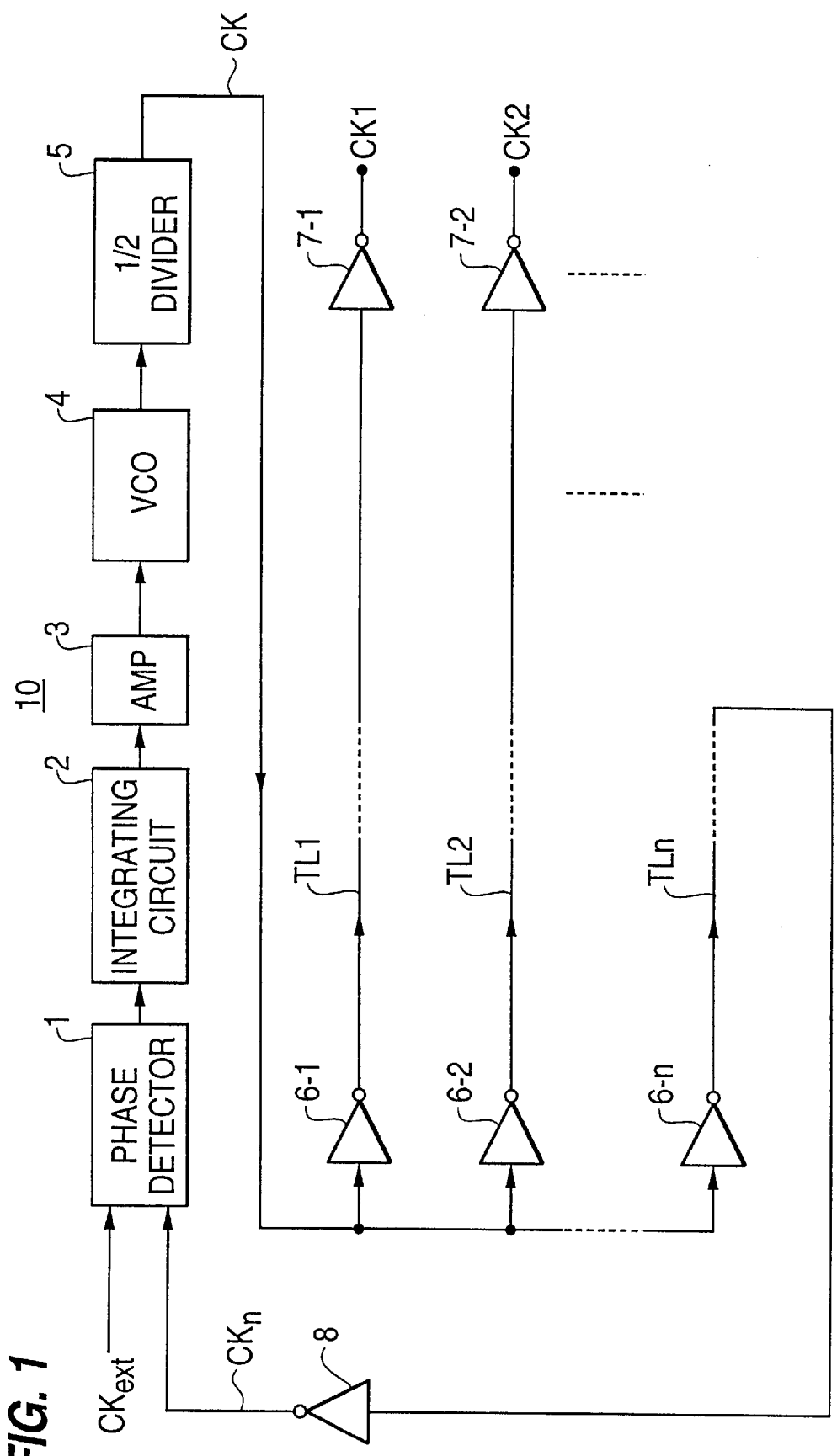
FIG. 1 is a block diagram of an example of a configuration of a general clock distributing apparatus adopting a CMOS full level transmission system.

FIG. 1 is a block diagram of an example of the configuration of a general clock distributing apparatus adopting a CMOS full level transmission system.

A clock distributing apparatus 10 is configured by a phase detector 1 constituted by a multiplier and the like, an integrating circuit 2, an amplifier (AMP) 3, a voltage controlled oscillator (VCO) 4, a ½ frequency divider 5, CMOS drivers 6-1, 6-2, ..., 6-n provided at the transmission side, CMOS drivers 7-1, 7-2, ..., (7-n: not shown) provided at the circuit block side, a CMOS inverter 8 for clock feedback, and n number of clock transmission lines TL1, TL2, ..., $TL_n$ connecting the CMOS drivers 6-1 to 6-n and the CMOS drivers 7-1, 7-2, ..., (7-n).

A phase locked loop (PLL) circuit is configured by the phase detector 1, the integrating circuit 2, the amplifier 3, the voltage controlled oscillator 4, the ½ frequency driver 5, the CMOS driver 6-n, and the CMOS inverter 8. The phase of the transmitted clock signal is adjusted to the same phase as a reference clock signal $CK_{ext}$.

The transmitted clock signal CK adjusted in phase as mentioned above is inverted in level by the CMOS drivers 6-1, 6-2, ..., 6-n and sent to the clock transmission lines TL1, TL2, ..., TLn at the voltage level.

The inverted clock signals transmitted by the clock transmission lines TL1, TL2, ..., TLn are received by the CMOS drivers 7-1, 7-2, ..., (7-n: not shown) provided at the circuit block side and inverted in level further and are supplied to the circuit blocks as the clock signal CK1, CK2, ...

However, the lengths of the clock transmission lines TL1, TL2, ..., (7-n: not shown) are not equal and the capacitances of the interconnections and the resistances of the interconnections are different, so the phases of the clock signals CK1, CK2, ... distributed to each of the circuit blocks become different.

Also, actually, the levels of the capacitances C1 to Cn of the clock transmission lines TL1 to TLn are determined by various factors such as the interconnections, gates, sources, drains, production process, shape, etc., even when designing to the most suitable drive capacities of the drivers 6-1 to 6-n and the drivers 7-1 to (7-n: not shown) based on the levels of the capacitances C1 to Cn. It is difficult to compensate for fluctuations in the clock signals including fluctuations caused at the production process.

The preferred embodiments of the present invention will now be explained in detail with reference to the drawings.

Figure 2:
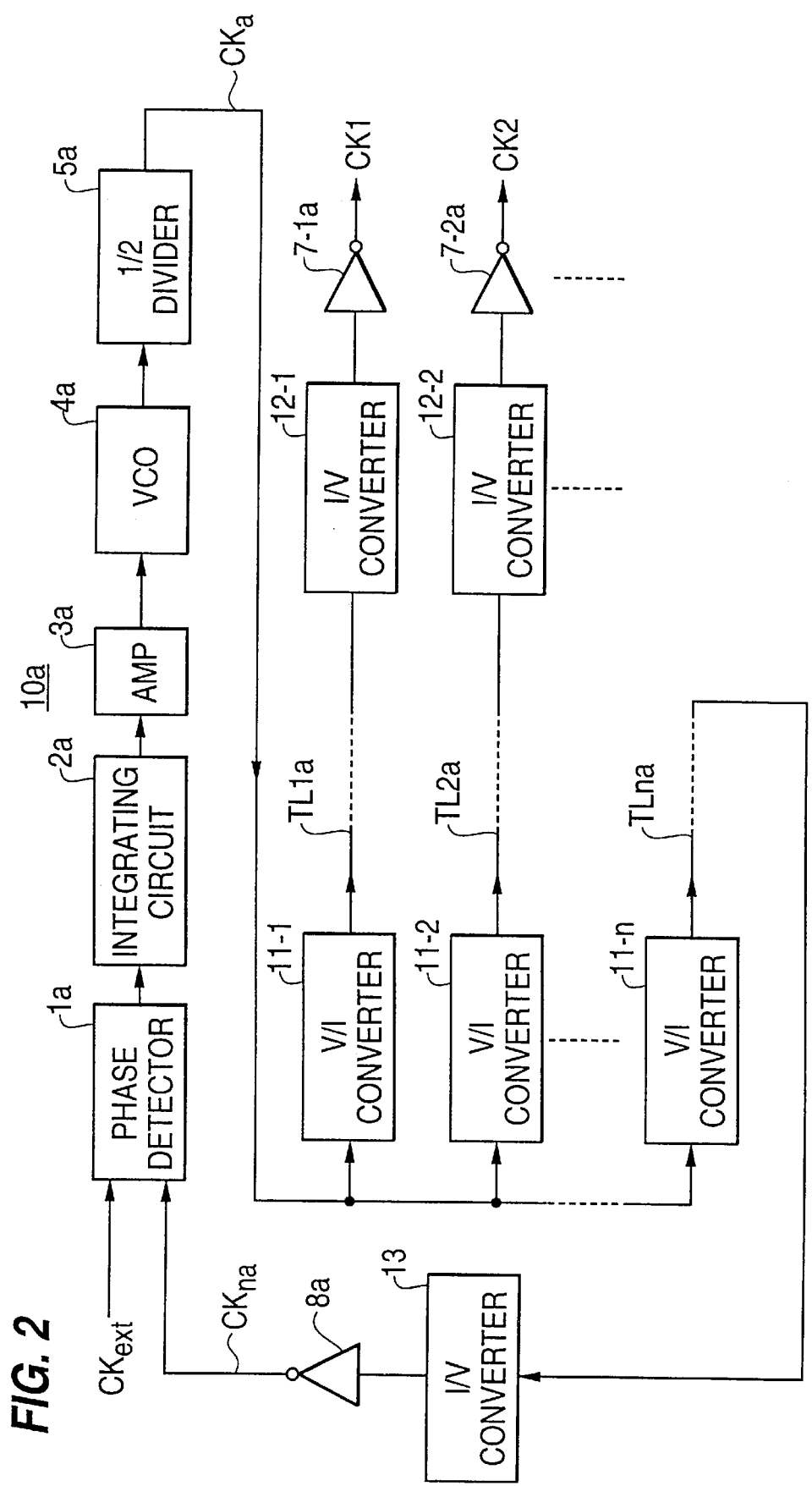
FIG. 2 is a block diagram of an embodiment of a clock distributing apparatus according to the present invention.

FIG. 2 is a block diagram of an embodiment of a clock distributing apparatus according to the present invention.

A clock distributing apparatus 10a is configured by a phase detector 1a constituted by a multiplier and the like, an integrating circuit 2a, an amplifier (AMP) 3a, a voltage controlled oscillator (VCO) 4a, a ½ frequency driver 5a, CMOS drivers 7-1a, 7-2a, ... (7-na: not shown) provided at the circuit block side, an CMOS inverter 8a for clock feedback, voltage/current (V/I) converters 11-1, 11-2, ..., 11-n for transmission, current/voltage (I/V) converters 12-1, 12-2 ..., (12-n: not shown) provided before the CMOS drivers 7-1a, 7-2a, ... (7-na: not shown) provided at the circuit block side, an I/V converter 13 provided between an input of the CMOS inverter 8a for clock feedback and an output of the V/I converter 11-n, and n number of clock transmission lines TL1a, TL2a, ..., TLna connecting between the V/I converters 11-1 to 11-n and I/V converters 12-1 to (12-n: not shown).

A PLL circuit is configured by the phase detector 1a, the multiplier 2a, the amplifier 3a, the voltage controlled oscillator 4a, the ½ frequency driver 5a, the V/I converter 11-n, the I/V converter 13, and the CMOS inverter 8a. A phase of transmitted clock signal CKn is adjusted to the same phase as a reference clock signal $CK_{ext}$ or to have a predetermined relationship of the phase.

Figure 3:
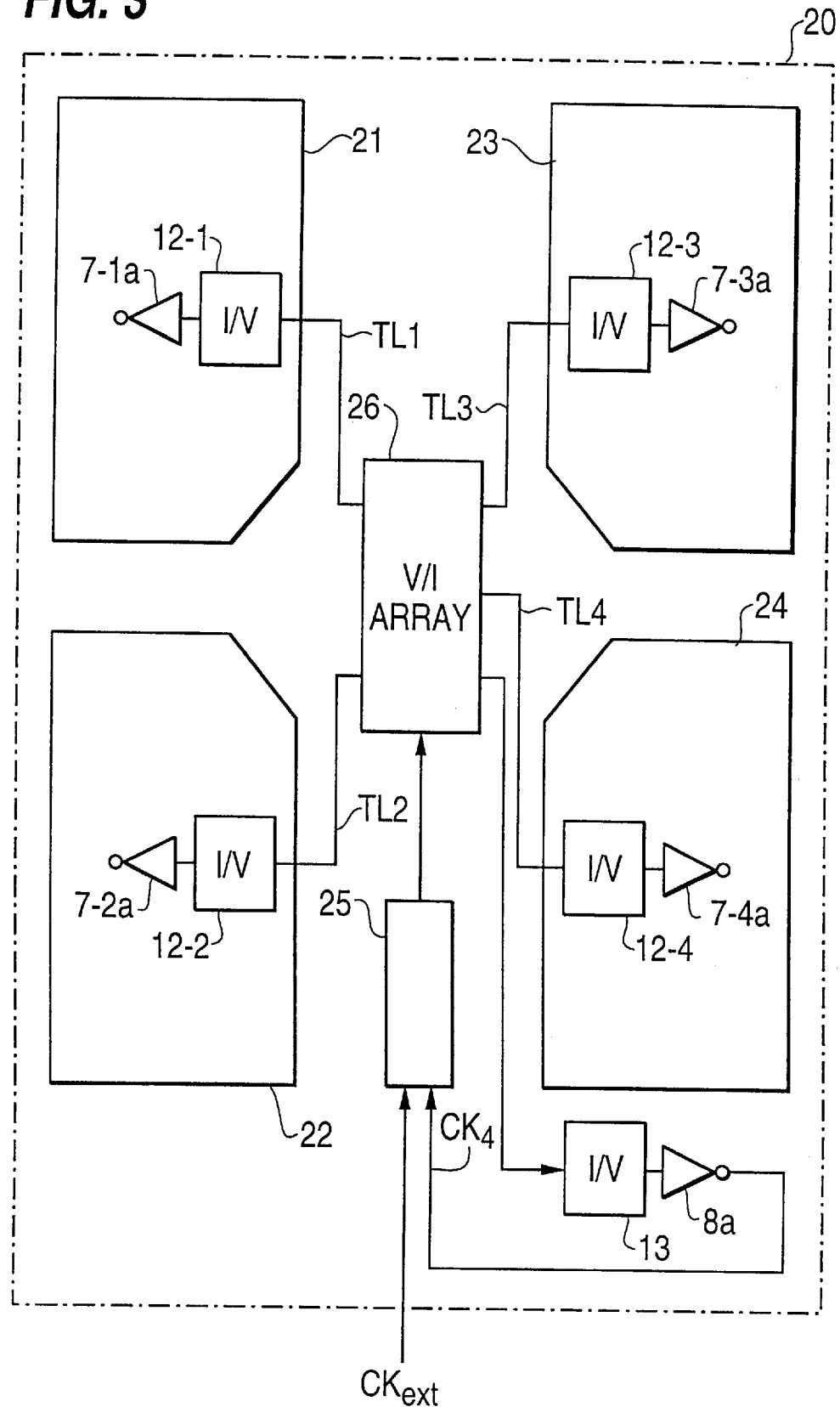
FIG. 3 is a block diagram of an embodiment in the case of four circuit blocks to which the clocks are distributed using a clock distributing apparatus shown in FIG. 2.

FIG. 3 is a view of the system configuration of a chip in the case of four circuit blocks to which clock signals are distributed using the clock distributing apparatus 10a in FIG. 2.

In FIG. 3, 20 represents an integrated circuit (IC) chip with four circuit blocks 21, 22, 23, 24.

In the figure, 25 represents a series circuit of the phase detector 1a, the multiplier 2a, the amplifier 3a, the voltage controlled oscillator 4a, and the ½ frequency driver 5a, and 26 represents an array of the V/I converters. The series circuit 25 and the array of the V/I converters 26 correspond to the circuit configuration of FIG. 2.

The clock distributing apparatus 10a is configured to convert the transmitted clock signal CKa of the voltage level, which is adjusted in phase to the same phase as the reference clock signal or to have a predetermined relationship of the phase, into current signal by the V/I converters 11-1 to 11-n, send the current signals to the clock transmission lines TL1a to TLna, convert the clock signals, that is, the current signals transmitted to the clock transmission lines TL1a to TLna, into voltage levels by the I/V converters 12-1 to (12-n), and supply the voltage level signals to the circuit blocks through the CMOS inverters 7-1a to (7-na).

An explanation will next be made of a concrete example and functions of a V/I converter 11 and an I/V converter 12, the principal parts of the present apparatus, with reference to FIG. 4.

Figure 4:
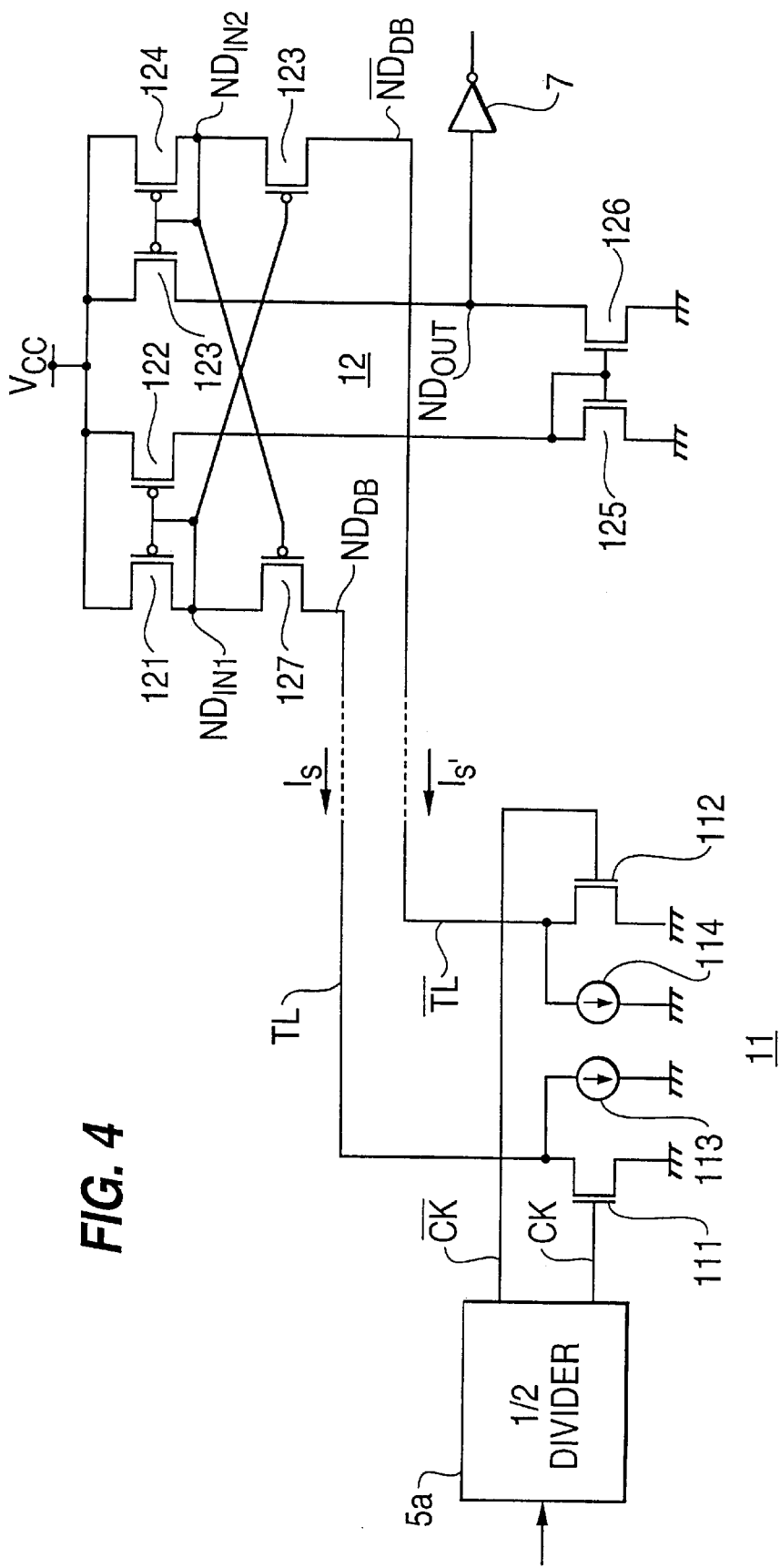
FIG. 4 is a circuit diagram of an example of a concrete configuration of a voltage/current converter and a current/voltage converter according to the present invention.

FIG. 4 is a circuit diagram of an example of the concrete configuration of the V/I converter 11 and the I/V converter 12 (13) according to the present invention. Namely, in the present circuit, the ½ frequency divider 5a is configured to output the transmitted clock signals CK, $\overline{CK}$ having complementary levels, while the clock transmission lines are constituted by two transmission lines TL, $\overline{TL}$ transmitting complementary signal currents.

The V/I converter 11 is configured as n-channel MOS transistors 111, 112 and current sources 113, 114.

The n-channel MOS transistor 111 and the current source 113 are connected in parallel between a terminal of the transmission line TL and a ground line, and the n-channel MOS transistor 112 and the current source 114 are connected in parallel between a terminal of the transmission line $\overline{TL}$ and the ground line. A gate of the n-channel MOS transistor 111 is connected to a supply line of the clock signal, and a gate of the n-channel MOS transistor 112 is connected to a supply line of the clock signal $\overline{CK}$.

In the V/I connecter 11, gates voltage of the n-channel MOS transistors 111, 112 are controlled by the clock signals CK, $\overline{CK}$ having complementary levels. The magnitudes of the current signals $I_s$, $I_{s'}$ flowing over the transmission lines TL, $\overline{TL}$ are determined by the supplied gate voltage.

Note that, in the V/I converter 11, it is not always necessary to provide the current sources 113, 114.

The I/V converter 12 is configured by the p-channel MOS transistors 121 to 124 and n-channel MOS transistors 125 to 128.

These transistors are connected as explained below.

Namely, the sources of the p-channel MOS transistors 121 to 124 are connected to a supply line of a power supply voltage Vcc, and the sources of the n-channel MOS transistors 125, 126 are grounded.

A drain of the p-channel MOS transistor 121 is connected to its own gate, a gate of the p-channel MOS transistor 122, and a source of the p-channel MOS transistor 127.

A first input terminal $ND_{IN1}$ of the I/V converter is constituted by the connection point of the drain of the p-channel MOS transistor 121 and the source of the p-channel MOS transistor 127, and the connection point of the first input terminal $ND_{IN1}$ and gates of the p-channel MOS transistor 121, 122 are connected to a gate of the p-channel MOS transistor 128.

A drain of the p-channel MOS transistor 122 is connected to a drain and a gate of the n-channel MOS transistor 125, and the connection point of the drain and the gate is connected to a gate of the n-channel MOS transistor 126.

A drain of the p-channel MOS transistor 123 is connected to a drain of the n-channel MOS transistor 126. An output terminal $ND_{out}$ is constituted by the connection point. The output terminal $ND_{out}$ is connected to an input of the CMOS driver 7.

A gate of the p-channel MOS transistor 123 is connected to a gate and a drain of the p-channel MOS transistor 124. The connection point is connected to a gate of the p-channel MOS transistor 127.

The drain of the p-channel MOS transistor 124 is connected to the gates of the p-channel MOS transistors 123, 124 as mentioned above and a source of the p-channel MOS transistor 128. A second input terminal $ND_{IN2}$ of the I/V converter is constituted by the connection point.

A drain of the p-channel MOS transistor 127 is connected to another terminal of the transmission line TL. Namely, the p-channel MOS transistor 127 is connected in cascade between the first input terminal $ND_{IN1}$ and the other terminal of the transmission line TL. The gate is fed back a signal from the second input terminal $ND_{IN2}$ having a complementary level with a level of a signal from the first input terminal $ND_{IN1}$.

A drain of the n-channel MOS transistor 124 is connected to another terminal of the transmission line $\overline{TL}$. Namely, the n-channel MOS transistor 128 is connected in cascade between the second input terminal $ND_{IN2}$ and the other terminal of the transmission line $\overline{TL}$. The gate is fed back the signal from the first input terminal $ND_{IN1}$ having a complementary level with a level of the signal from the second input terminal $ND_{IN2}$.

A current mirror circuit is constituted by n-channel MOS transistors 125, 126. A differential amplifier is constituted by the current mirror circuit and the p-channel MOS transistors 122, 123.

As explained above, since the I/V converter 12 is configured by the p-channel MOS transistor 127 connected in cascade between the first input terminal $ND_{IN1}$ and the other terminal of the transmission line TL and the p-channel MOS transistor 128 connected in cascade between the second input terminal $ND_{IN2}$ and the other terminal of the transmission line $\overline{TL}$, the gate of the p-channel MOS transistor 127 is fed back the signal from the second input terminal $ND_{IN2}$ having a complementary level with the level of the signal from the first input terminal $ND_{IN1}$, and the gate of the p-channel MOS transistor 128 is fed back the signal from the first input terminal $ND_{IN1}$ having a complementary level with the level of the signal from the second terminal $ND_{IN2}$, the signal swings of the transmission line TL and the transmission line $\overline{TL}$ are suppressed to zero.

An explanation will be made below of the reasons why the above-mentioned configuration can suppress the signal swings to zero. Note that, here, the explanation will be made of the case where the p-channel MOS transistors 127, 128 are already in the on-state.

Note that, in the following explanation, $i_s$, $-i_{s'}$ represent alternating-current components of the signal current flowing through the p-channel MOS transistors 121, 124, and $g_{m121}$, $g_{m124}$ represent mutual conductances of the p-channel MOS transistors.

When the signal currents $I_s$, $I_{s'}$ flow through the transmission lines TL, $\overline{TL}$, a voltage drop represented by $i_s \cdot (1/g_{m121})$ is caused.

As a result, the amplitude of the signal at the first input terminal $ND_{IN1}$ changes and flows into the p-channel MOS transistor 127.

At this time, at the p-channel MOS transistor 124, a voltage drop represented by $(-i_s) \cdot (1/g_{m124})$, that is to say, a phenomenon in which the level increases by an amount corresponding to the voltage drop, is caused. Due to this, the amplitude of the signal at the second input terminal $ND_{IN2}$ changes and flows into the p-channel MOS transistor 128.

The signal voltage increased in level by $i_s \cdot (1/g_{m121})$ from the first input terminal $ND_{IN1}$ is supplied to the gate of the p-channel MOS transistor 128.

Due to this, at the p-channel MOS transistor 127, a voltage drop represented by $i_s \cdot (1/g_{m121})$ is compensated for to increase the level, and at the p-channel MOS transistor 128, the voltage gain represented by $is \cdot (1/g_{m124})$ is compensated for to decrease the level.

Accordingly, as $g_{m121} \approx g_{m124}$, the change of the amplitude of the signal at the node $ND_{DB}$, which is the connection point of the p-channel MOS transistor 127 and the transmission line TL, becomes equivalent to zero. As a result, the generation of a signal swing at the transmission line TL is prevented.

Similarly, the change of the amplitude of the signal at the node $\overline{ND_{DB}}$, which is the connection point of the p-channel MOS transistor 128 and the transmission line $\overline{TL}$, becomes equivalent to zero. As a result, the generation of a signal swing at the transmission line $\overline{TL}$ is prevented.

A voltage $V_{DB}$ of the node $ND_{DB}$ and a voltage $\overline{V_{DB}}$ of the node $\overline{ND_{DB}}$, when the signal current flows, may be represented by the following expressions.

$$V_{DB} = V_{CC} - |V_{thp}| - \{I_s/[(\mu_P \cdot \epsilon_o \cdot \epsilon_s/2) \cdot (W_{124}/L_{124})]\}^{1/2} - V_{thN} - \{I_s/[(\mu_n \cdot \epsilon_o \cdot \epsilon_s/2) \cdot (W_{127}/L_{127})]\}^{1/2} \quad (1)$$

-continued $$\overline{V}_{DB} = V_{CC} - |V_{thp}| - \tag{2}$$
$$\{I_s/[(\mu_P \cdot \epsilon_o \cdot \epsilon_s/2) \cdot (W_{121}/L_{121})]\}^{1/2} -$$
$$V_{thN} - \{I_s/[(\mu_n \cdot \epsilon_o \cdot \epsilon_s/2) \cdot (W_{128}/L_{128})]\}^{1/2}$$

Here, $V_{thp}$ represents a threshold voltage of the p-channel MOS transistor, $V_{thN}$ represents a threshold voltage of the n-channel MOS transistor, $\mu_p$ represents the Hall mobility, $\epsilon_o$ represents the space permittivity, $\epsilon_s$ represents the relative permittivity of a silicon gate oxide film, $L_{121}$, $L_{124}$, $L_{127}$, $L_{128}$ represent channel lengths of the p-channel MOS transistors 121, 124 and the p-channel MOS transistors 127, 128, and $W_{121}$, $W_{124}$, $W_{127}$, $W_{128}$ represent channel widths of the p-channel MOS transistors 121, 124 and the p-channel MOS transistors 127, 128.

Generally, considering the relationships of $(W_{121}/L_{121})=(W_{124}/L_{124})$, $(W_{127}/L_{127})=(W_{128}/L_{128})$, in order to suppress the signal swing at the transmission line TL and the transmission line $\overline{TL}$ to zero, the node voltage $V_{DB}$ and the node voltage $\overline{V_{DB}}$ should satisfy the following relationship:

$$V_{DB} = \overline{V_{DB}} \tag{3}$$

Accordingly, the following relative expression is formed by the above expressions (1) and (2):

$$I_s/[(\mu_p \cdot \epsilon_o \cdot \epsilon_s/2) \cdot (W_{121}/L_{121})]\}^{1/2} + \tag{4}$$
$$\{I_s/[(\mu_n \cdot \epsilon_o \cdot \epsilon_s/2) \cdot (W_{127}/L_{127})]\}^{1/2} =$$
$$\{I_s/[(\mu_p \cdot \epsilon_o \cdot \epsilon_s/2) \cdot (W_{121}/L_{121})]\}^{1/2} +$$
$$\{I_s/[(\mu_n \cdot \epsilon_o \cdot \epsilon_s/2) \cdot (W_{127}/L_{127})]\}^{1/2}$$

From the expression (4), the following relative expressions are derived:

$$(\mu_p \cdot \epsilon_o \cdot \epsilon_s/2) \cdot (W_{P1}/L_{P1}) = (\mu_n \cdot \epsilon_o \cdot \epsilon_s/2) \cdot (W_{N5}/L_{N5}) \tag{6}$$

or $$g_{m121} = g_{m127}$$

Here, $g_{m121}$ represents a mutual conductance of the p-channel MOS transistor 121 (124), and $g_{m127}$ represents a mutual conductance of the p-channel MOS transistor 127 (128).

Accordingly, by constituting the circuit of FIG. 3 based on the conditions of the above expressions (5) or (6), at the time of V/I conversion, it is possible to prevent the generation of a signal swing at the transmission lines TL, $\overline{TL}$, which are large capacitance nodes, and satisfy the relationship of the above expression (3).

Note that, if the voltage drop $V_{Gs}$ between the gates and the sources of the p-channel NOS transistors 127, 128 becomes a disadvantage, it is desirable that depletion type transistors be adopted.

An explanation will be made next of the operation by the above-described configuration of FIG. 2 and FIG. 4.

First, an operating bias voltage is supplied to the gates of the p-channel MOS transistors 127, 128, the first input terminal $ND_{IN1}$ and transmission line TL are held in a conductive state, and the second input terminal $ND_{IN2}$ and transmission line $\overline{TL}$ are held in the conductive state.

The transmitted clock signals CK, $\overline{CK}$, adjusted in phase by the PLL circuit and complementary in level, for example, output from the ½ frequency circuit 5a are input to each of the V/I converters 12-1 to 12-n.

In the V/I converters 11-1 to 11-n, gate voltages of the n-channel MOS transistors 111, 112 are controlled by the clock signals CKa, $\overline{CKa}$ having complementary levels. The magnitudes of the current signals $I_s$, $I_{s'}$ flowing through the transmission lines TL, $\overline{TL}$ are determined by the value of the supplied gate voltage. Namely, the clock signals CKa, $\overline{CKa}$ having voltage levels are converted to current signals and sent to the transmission lines TL, $\overline{TL}$.

When the clock signal currents $I_s$, $I_{s'}$ flow, the gate levels of the p-channel MOS transistors 121, 122 connected to the first input terminal $ND_{IN1}$ and the p-channel MOS transistors 123, 124 connected to the second input terminal $ND_{IN2}$ in each of the I/V converters 12-1, 12-2, ... become low, so the p-channel MOS transistors 121 to 124 switch from the non-conductive states to the conductive states.

Due to this, the signals which are amplified by the differential amplifier constituted by the current mirror circuits comprising the p-channel MOS transistors 122, 123 and the n-channel MOS transistors 125, 126 and are converted to the voltage level are output from the output terminal $ND_{OUT1}$ to the CMOS driver 7. Due to this, the clock signals CK1a to CKna are supplied to each of the circuit blocks.

In the I/V converter 12, for example the signal currents $I_s$, $I_{s'}$ flow and the p-channel MOS transistor 121 switches from the non-conductive state to the conductive state. Due to this, a voltage drop represented by $i_s \cdot (1/g_{m121})$ is caused.

As a result, the amplitude of the signal at the first input terminal $ND_{IN1}$ is changed to decrease and the result is input to the p-channel MOS transistor 127.

On the contrary, when the p-channel MOS transistor 128 switches from the non-conductive state to the conductive state, a voltage gain of $i_s \cdot (1/g_{m124})$ corresponding to the voltage drop of the p-channel MOS transistor 124 is caused.

As a result, the amplitude of the signal at the second input terminal $ND_{IN2}$ is changed to increase and the result is input to the p-channel NOS transistor 128.

The signal voltage increased in level by $i_s \cdot (1/g_{124})$ from the second input terminal $ND_{IN2}$ is supplied to the gate of the p-channel MOS transistor 127, while the signal voltage decreased in level by $i_s \cdot (1/g_{m121})$ from the first input terminal $ND_{IN1}$ is supplied to the gate of the p-channel MOS transistor 128.

Due to this, at the p-channel MOS transistor 127, the voltage drop represented by $i_s \cdot (1/g_{m121})$ is compensated for to increase the level, and at the p-channel MOS transistor 128, the voltage gain represented by $i_s \cdot (1/g_{m121})$ is compensated for to decrease the level.

Accordingly, the change of the amplitude of the signal at the node $ND_{DB}$, which is the connection point of the p-channel MOS transistor 127 and the transmission line TL, becomes equivalent to zero. As a result, no signal swing occurs at the transmission line TL.

Similarly, the change of the amplitude of the signal at the node $\overline{ND_{DB}}$, which is the connection point of the p-channel MOS transistor 128 and the transmission line $\overline{TL}$, becomes equivalent to zero. As a result, no signal swing occurs at the transmission line $\overline{TL}$.

As explained above, in the present embodiment, the clock distributing apparatus is configured to convert the transmitted clock signal CKa, adjusted in voltage level to the same phase as the reference clock signal, into a current signal by the V/I converters 11-1 to 11-n, send the current signals to the clock transmission lines TL1a to TLna, convert the clock signals, that is, the current signals transmitted to the clock transmission lines TL1a to TLna, into voltage levels by the I/V converters 12-1 to (12-n), and supply the voltage level signals to the circuit blocks through the CMOS inverters 101a to (7-na).

As a result, in the same way as described above, it becomes no longer necessary to charge and discharge the transmission lines TL1, $\overline{\text{TL}}$ having large capacitances and it is possible to realize a high speed operation.

Also, it is possible to realize a high speed operation even if the capacitance of the data line is large such as 16bRICS→32bRISC→64bRISC.

Note that, in the above-mentioned embodiments, the explanation was made of the case where n-channel type transistors were used as the MOS transistors connecting the first input terminal $\text{ND}_{IN1}$ and the transmission line TL and the second input terminal $\text{ND}_{IN2}$ and the transmission line $\overline{\text{TL}}$ in cascade, but the present invention is not restricted by these embodiments. The present invention can be applied to either p-channel type MOS transistors or n-channel MOS transistors. In this case too, similar effects can be obtained as with the above-mentioned embodiments.

Many widely different embodiments of the present invention may be constructed without departing from the spirit and scope of the present invention. The invention is not restricted to the specific embodiments described above.

What is claimed is:

1. A clock distributing apparatus having a plurality of circuit blocks supplied with clock signals and a plurality of clock transmission lines supplying said clock signals to said plurality of circuit blocks, comprising:

a plurality of voltage/current converters which convert the clock signals of a voltage level to current signals and send the current signals to the sending side of the clock transmission lines; and a plurality of current/voltage converters which convert the current signals to clock voltage signals at the receiving side of the clock transmission lines.

2. A clock distributing apparatus according to claim 1, having a phase locked loop circuit which adjusts a phase of one of said clock signals to give a predetermined phase relationship to a reference clock signal.

3. A clock distributing apparatus, comprising:

first and second transmission lines;

a voltage/current converter which converts a transmitted clock signal of a voltage level to current signal having complementary levels with each other and sends the current signals to the first and the second transmission lines; and a current/voltage converter which converts the current signals transmitted by the first and the second transmission lines to voltage clock signal.

4. A clock distributing apparatus according to claim 3, having a phase locked loop circuit which adjusts a phase of said transmitted clock signal to give a predetermined phase relationship to a reference clock signal.

5. A clock distributing apparatus according to claim 3, wherein the current/voltage converter is provided with;

a first input terminal;

a second input terminal having a complementary relationship with the first input terminal;

a first metal insulator semiconductor (MIS) transistor and a diode-connected second MIS transistor which are connected in series between the first input terminal and a first power source;

a third MIS transistor and a diode-connected fourth MIS transistor which are connected in series between the second input terminal and the first power source;

a fifth MIS transistor which constitutes a current mirror circuit with the second MIS transistor;

a sixth MIS transistor which constitutes a current mirror circuit with the fourth MIS transistor;

a first load MIS transistor connected to a drain of the fifth MIS transistor; and a second load MIS transistor connected to a drain of the sixth MIS transistor;

a gate of the first MIS transistor being connected to a connection point of the third MIS transistor and the fourth MIS transistor, and a gate of the third MIS transistor being connected to the connection point of the first MIS transistor and the second MIS transistor.

* * * * *